(12) United States Patent
Mustafa et al.

(10) Patent No.: US 11,767,593 B2
(45) Date of Patent: Sep. 26, 2023

(54) HIGH TEMPERATURE VACUUM SEAL

(71) Applicant: Applied Materials, Inc., Santa Clara, CA (US)

(72) Inventors: Muhannad Mustafa, Milpitas, CA (US); Muhammad M. Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/948,571

(22) Filed: Sep. 20, 2022

(65) Prior Publication Data

US 2023/0015613 A1 Jan. 19, 2023

Related U.S. Application Data

(62) Division of application No. 16/844,601, filed on Apr. 9, 2020, now Pat. No. 11,479,859.

(51) Int. Cl.
  *C23C 16/40* (2006.01)
  *C23C 16/455* (2006.01)
  *C23C 16/458* (2006.01)
  *F16J 15/02* (2006.01)

(52) U.S. Cl.
  CPC ...... *C23C 16/45565* (2013.01); *C23C 16/458* (2013.01); *C23C 16/45557* (2013.01); *C23C 16/45574* (2013.01); *F16J 15/021* (2013.01)

(58) Field of Classification Search
  CPC ........ C23C 16/45565; C23C 16/45557; C23C 16/45574; C23C 16/458; C23C 16/4557; C23C 16/4409; C23C 16/455; C23C 16/4412; C23C 16/18; C23C 16/4481; F16J 15/021; B05D 1/60; H01L 45/1616

USPC ........... 118/715; 156/345.33, 345.34; 427/248.1, 8, 96.8, 237, 255.23, 255.28
See application file for complete search history.

(56) References Cited

U.S. PATENT DOCUMENTS

| | | | |
|---|---|---|---|
| 8,277,888 B2 | 10/2012 | Dedontney | |
| 9,017,481 B1* | 4/2015 | Pettinger | H01J 37/32449 118/724 |
| 9,758,868 B1* | 9/2017 | Breiling | C23C 16/4408 |
| 9,914,999 B2 | 3/2018 | Rasheed et al. | |
| 2018/0130652 A1 | 5/2018 | Pettinger et al. | |
| 2019/0032211 A1* | 1/2019 | Tucker | C23C 16/45565 |
| 2019/0271082 A1 | 9/2019 | Wang et al. | |

FOREIGN PATENT DOCUMENTS

KR  20150077108 A  7/2015

OTHER PUBLICATIONS

PCT International Search Report and Written Opinion in PCT/US2021/026590 dated Jul. 21, 2021, 12 pages.

* cited by examiner

*Primary Examiner* — Rudy Zervigon
(74) *Attorney, Agent, or Firm* — Servilla Whitney LLC

(57) ABSTRACT

Gas distribution assemblies and process chambers comprising gas distribution assemblies are described. The gas distribution assembly includes a gas distribution plate, a lid and a primary O-ring. The primary O-ring is positioned between a purge channel of a first contact surface of the gas distribution plate and a second contact surface. Methods of sealing a process chamber using the disclosed gas distribution assemblies are also described.

16 Claims, 8 Drawing Sheets

HIGH TEMPERATURE VACUUM SEAL

CROSS-REFERENCE TO RELATED APPLICATIONS

This application is a Divisional application of U.S. application Ser. No. 16/844,601, filed on Apr. 9, 2020, the entire disclosure of which is hereby incorporated by reference herein.

TECHNICAL FIELD

Embodiments of the present disclosure generally relate to apparatuses and methods for vacuum sealing a process chamber. In particular, embodiments of the disclosure are directed to apparatuses and methods to enable high temperature vacuum sealing with decreased oxygen permeation.

BACKGROUND

During semiconductor manufacturing, process chambers often require high temperature vacuum seals, ultra-pure environments and low molecular oxygen content during processing. Process chamber components are connected with an O-ring to prevent metal-metal contact and form a seal. The seal formed is mostly fluid-tight but can allow permeation of some atmospheric gases. The permeation of gases is temperature sensitive, with increased permeation at greater temperatures. Since process chambers are often operated at elevated temperature, gas permeation of the O-ring increases significantly.

In convention processing chambers, dual seals with sufficient differential pumping are often used with high temperature vacuum assemblies. Application of dual seals has limitations where space constraints are present. Additionally, incorporating dual seals typically has a longer lead time as well and increased cost for custom O-rings. Therefore, there is a need in the art for apparatus and methods for sealing process chamber environments from ambient gaseous species migration.

SUMMARY

One or more embodiments of the disclosure are directed to gas distribution assemblies comprising a gas distribution plate, a lid and a primary O-ring. The gas distribution plate has a front surface and a back surface defining a thickness. The gas distribution plate comprises a plurality of apertures extending through the thickness of the gas distribution plate. The gas distribution plate has a sealing region at an outer edge. The sealing region has a first contact surface and a second contact surface and the first contact surface comprises a purge channel formed therein. The lid has a front surface and a back surface defining a thickness. The front surface of the lid is positioned adjacent the back surface of the gas distribution plate. The lid comprises a purge gas line inlet with an opening at the front surface and a purge gas line outlet with an opening at the front surface. The inlet opening and outlet opening are aligned with the purge channel of the first contact surface. The primary O-ring is positioned between the purge channel of the first contact surface and the second contact surface.

Additional embodiments of the disclosure are directed to process chambers comprising a chamber body having sidewalls and bottom bounding a process volume. A substrate support is within the process volume and has a support surface. A gas distribution assembly comprising a gas distribution plate, a lid and a primary O-ring bounds the process volume. The gas distribution plate has a front surface facing the support surface of the substrate support and a back surface defining a thickness. The gas distribution plate comprises a plurality of apertures extending through the thickness of the gas distribution plate. The gas distribution plate has a sealing region at an outer edge and the sealing region has a first contact surface and a second contact surface. The first contact surface comprises a purge channel formed therein. The lid has a front surface and a back surface defining a thickness. The front surface of the lid is positioned adjacent the back surface of the gas distribution plate. The lid comprises a purge gas line inlet with an opening at the front surface and a purge gas line outlet with an opening at the front surface. The inlet opening and outlet opening are aligned with the purge channel of the first contact surface and the primary O-ring positioned between the purge channel of the first contact surface and the second contact surface.

Further embodiments of the disclosure are directed to methods of sealing a process chamber. A pressure in a purge gas line is measured downstream of a purge gas line outlet aligned with a purge channel in a gas distribution assembly comprising a gas distribution plate and a lid separated by a primary O-ring. The purge gas line is in fluid communication with a purge channel and a purge gas line inlet. Each of the purge gas line inlet and purge gas line outlet are aligned with the purge channel. A flow of inert gas is provided into the purge channel so that there is substantially no pressure differential between the gas distribution plate and the purge channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
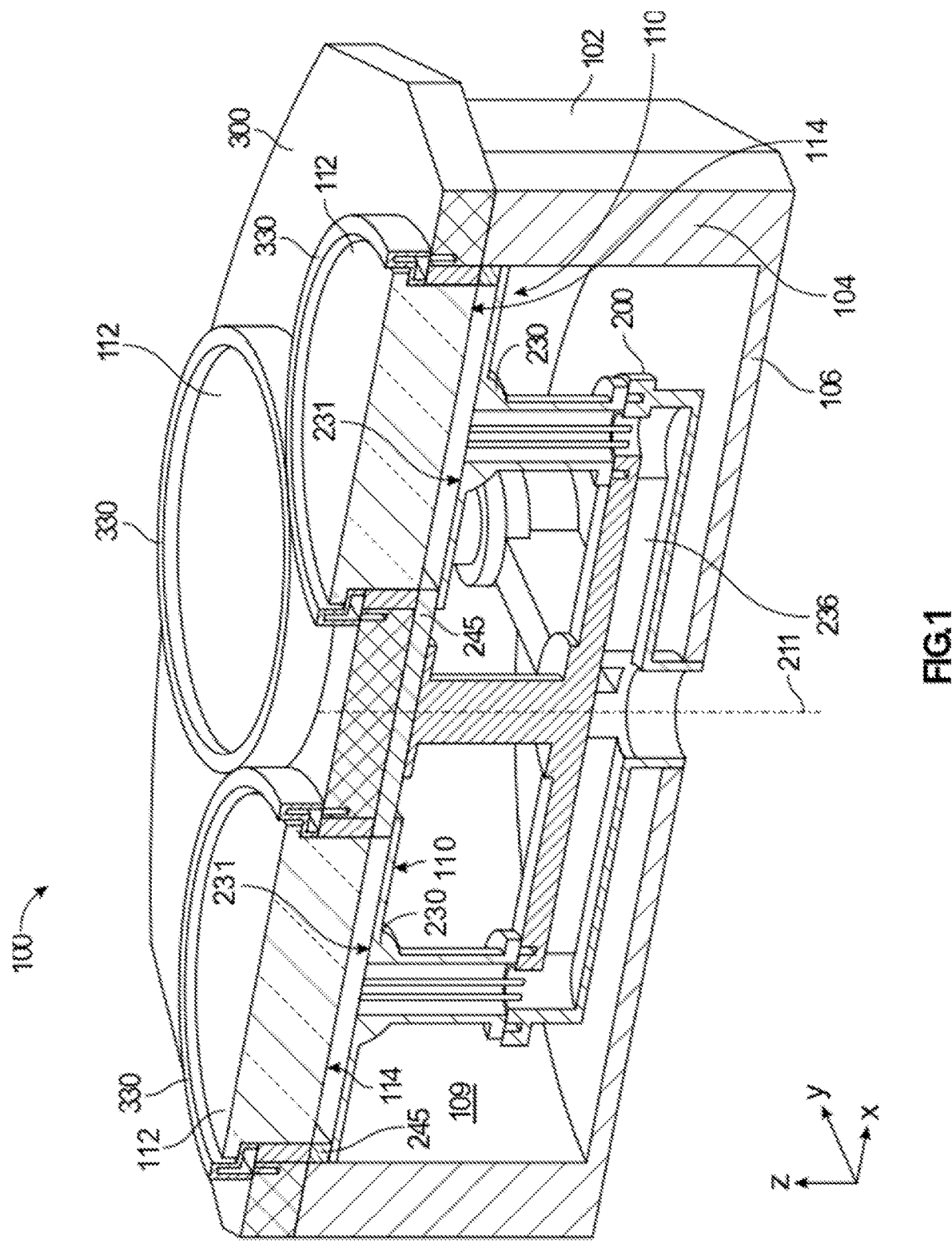
FIG. 1 shows a cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure advantageously provide techniques to enable high temperature vacuum sealing. Some embodiments provide apparatus and methods for efficient removal of gaseous species outgassed from O-rings, minimizing or eliminating negative effects of atmospheric molecular oxygen ($O_2$) in the processing environment.

Some embodiments of the disclosure are directed to gas distribution assemblies with a pump-purge channel along with single seal (O-ring). In some embodiments, the channel is continuously purged by an inert gas (e.g., Ar, $N_2$) to maintain equal pressure in the chamber and the channel. Stated differently, the pressure differential ($\Delta P$) between the channel and the process chamber is minimized. In some embodiments, the pressure different is substantially zero ($\Delta P=0$). The zero pressure differential prevents inert or purge gas (e.g., Ar, $N_2$) flowing into the reaction space of the chamber.

In some embodiments, a pressure transducer is used to control the pressure in the purge channel relative to the pressure in the process chamber. In some embodiments, the gas distribution assembly includes more than one purge gas channel, or the process chamber includes more than one gas distribution assembly with purge gas channels. In some embodiments, each purge channel pressure is individually controlled with respect to surrounding gas pressure. In some embodiments, purge gas (e.g., Ar, $N_2$) diffusion into the chamber or into a gas channel in the showerhead is substantially zero since purge channel will be continuously purged and pumped out. In some embodiments, a pulse-purge mechanism is used to remove or eliminate contamination due to O-ring defects or trapped gas.

Some embodiments of the disclosure use less space to incorporate the purge channel mechanism than conventional dual seal process chambers. In some embodiments, the process chamber is isolated from atmosphere without a dual seal arrangement as is understood by the skilled artisan. In some embodiments, high temperature induced O-ring outgassing is purged out of the system without flowing into the process cavity. In some embodiments, O-ring materials are not directly exposed to process chemistry. Some embodiments prevent O-ring defect migration and/or chemical bi-product flow into the chamber. Some embodiments provide gas distribution assemblies with improved manufacturing lead times relative to convention dual seal systems. In some embodiments, the oxygen ($O_2$) content in chamber is reduced.

Figure 2:
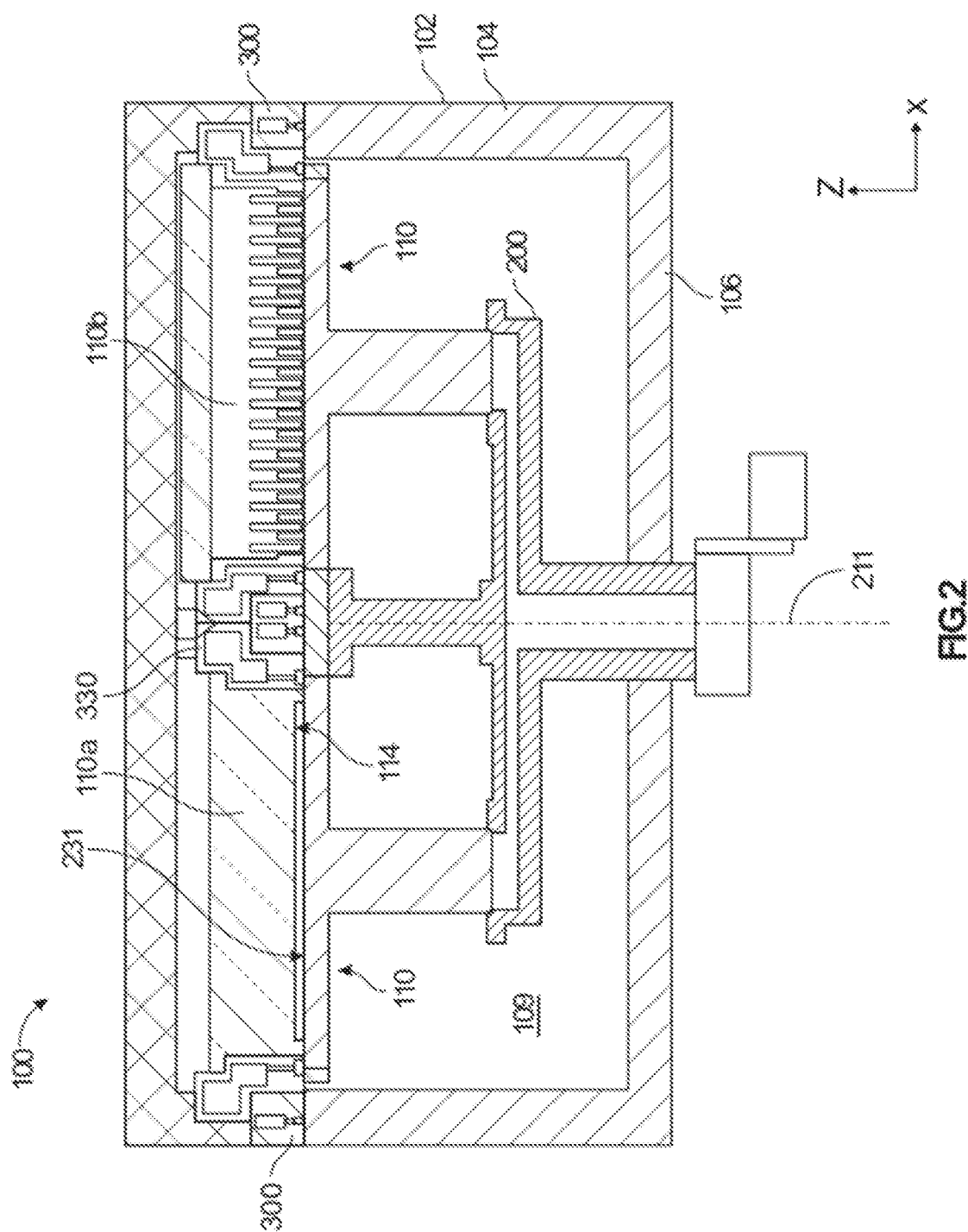
FIG. 2 shows a cross-sectional view of a processing chamber in accordance with one or more embodiment of the disclosure.

The disclosure provides gas distribution assemblies for use with single wafer or multi-wafer (also referred to a batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200 and top plate 300.

The processing chamber 100 has a housing 102 with walls 104 and a bottom 106. The housing 102 along with the top plate 300 define a processing volume 109, also referred to as an interior volume.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the heaters 230, as described below, and the front surface 114 of the gas injectors 112. In the illustrated embodiment, the heaters 230 act as substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
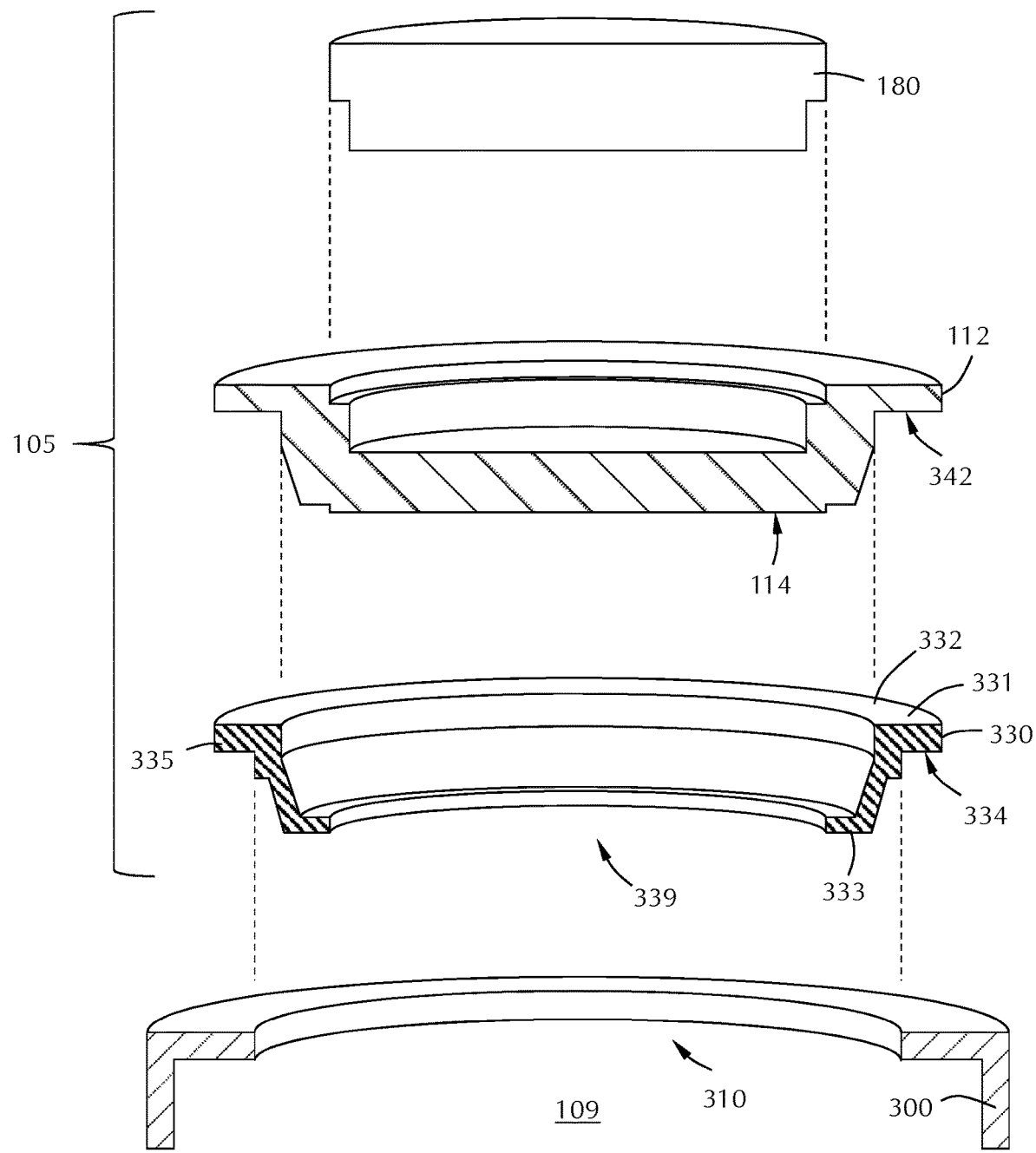
FIG. 3 is an exploded cross-sectional view of a processing station in accordance with one or more embodiment of the disclosure.

FIG. 3 illustrates an exploded view of a gas distribution assembly 105 for use in a processing station 110 or a process chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert. In some embodiments, the spacer 330 is connected to or in fluid communication with a vacuum (exhaust). In some embodiments, the spacer 330 is connected to or in fluid communication with a purge gas source.

The openings 310 in the top plate 300 can be uniformly sized or have different sizes. Different sized/shape gas injectors 112 can be used with a pump/purge spacer 330 that is suitably shaped to transition from the opening 310 to the gas distribution plate 112. For example, as illustrated, the pump/purge spacer 330 includes a top 331 and bottom 333 with a sidewall 335. When inserted into the opening 310 in the top plate 300, a ledge 334 is configured to be positioned in the opening 310.

The pump/purge spacer 330 includes an opening 339 in which a gas distribution plate 112 can be inserted. The gas distribution plate 112 illustrated has a flange 342 which can be in contact with the ledge formed by the back surface 332 adjacent the top 331 of the pump/purge spacer 330. The diameter or width of the gas distribution plate 112 can be any suitable size that can fit within the opening 339 of the pump/purge spacer 330. This allows gas injectors 112 of various types to be used within the same opening 310 in the top plate 300.

Figure 4:
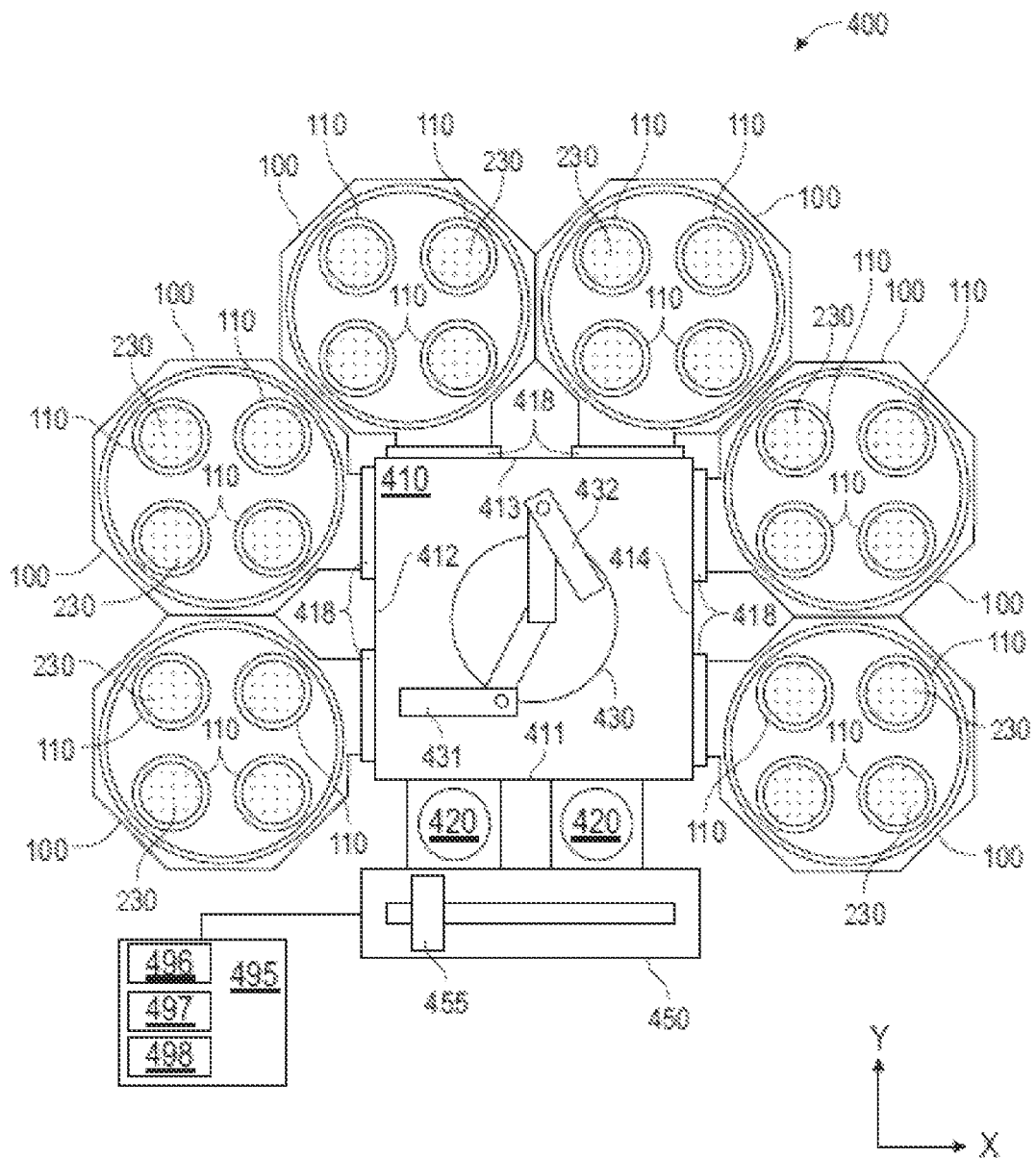
FIG. 4 is a schematic representation of a processing platform in accordance with one or more embodiment of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

In one or more embodiments, the processing chamber 100 further comprises at least one wafer on the support surface. In some embodiments, the first emissivity and the first temperature and/or the second emissivity and the second temperature provide a steady state temperature of the wafer in the first station and in the second station.

Figure 5:
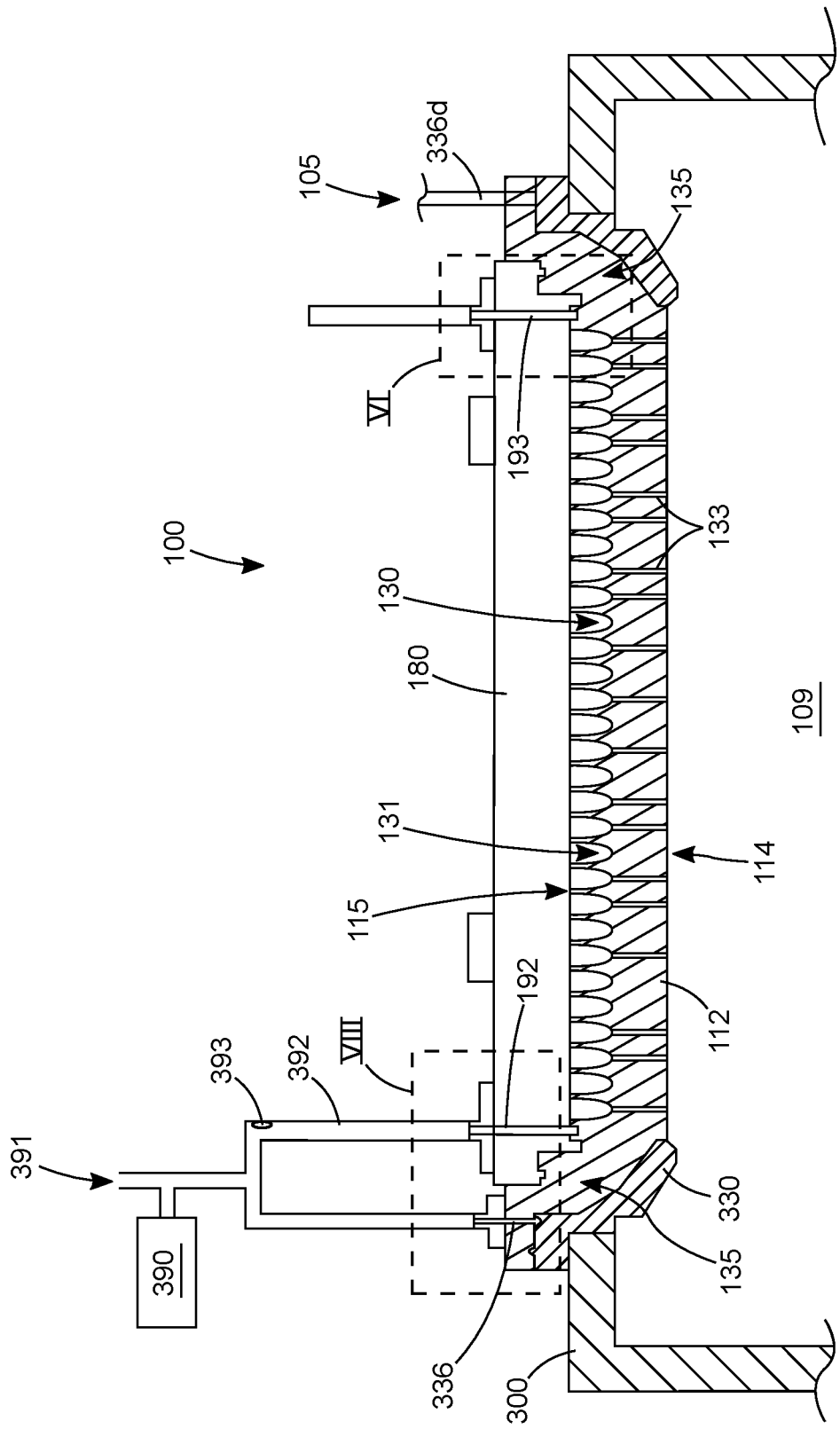
FIG. 5 is a cross-sectional schematic view of a processing chamber according to one or more embodiment of the disclosure.
Figure 6:
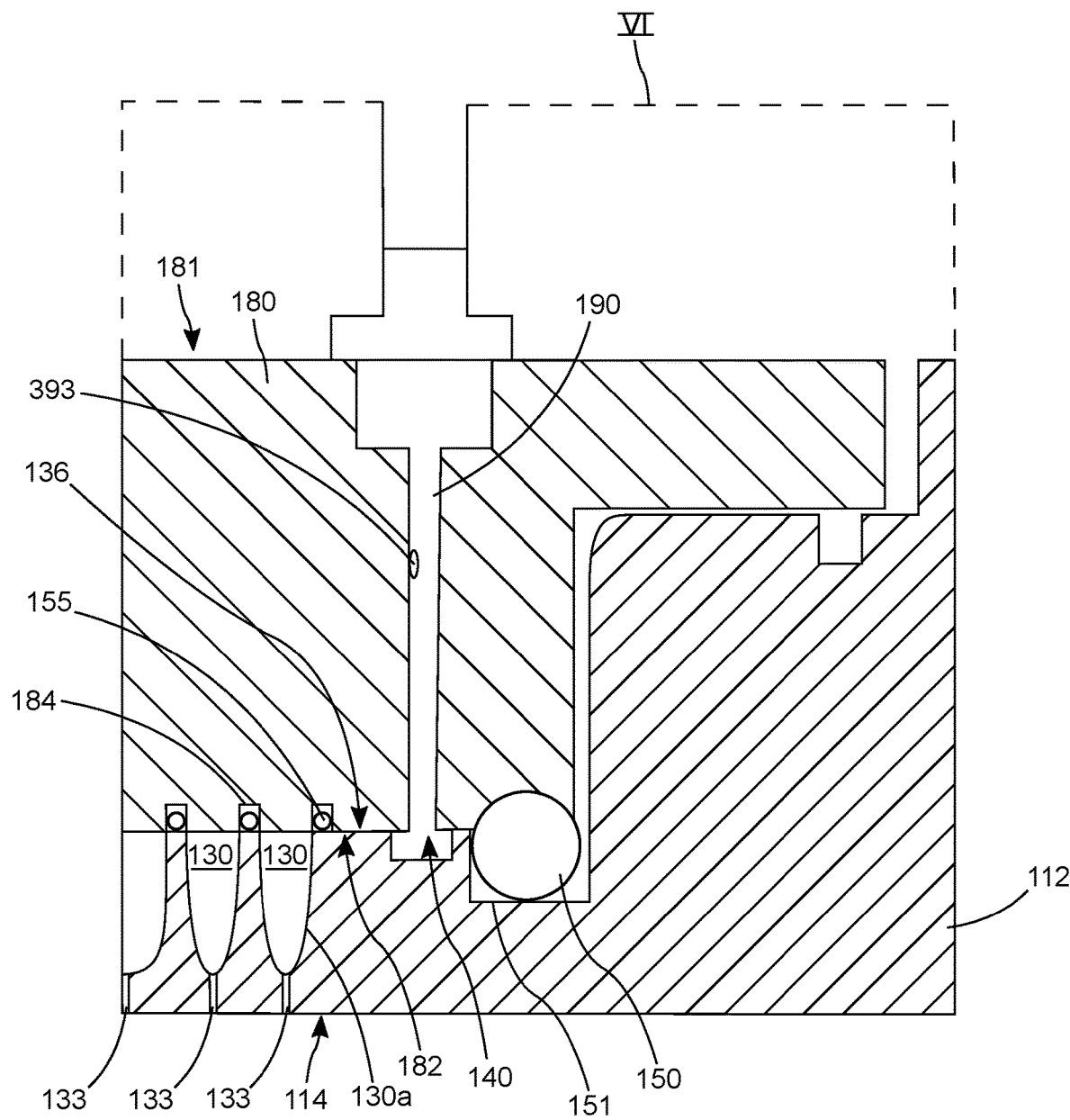
FIG. 6 is a partial cross-sectional schematic view of a region similar to region VI of FIG. 5.
Figure 7:
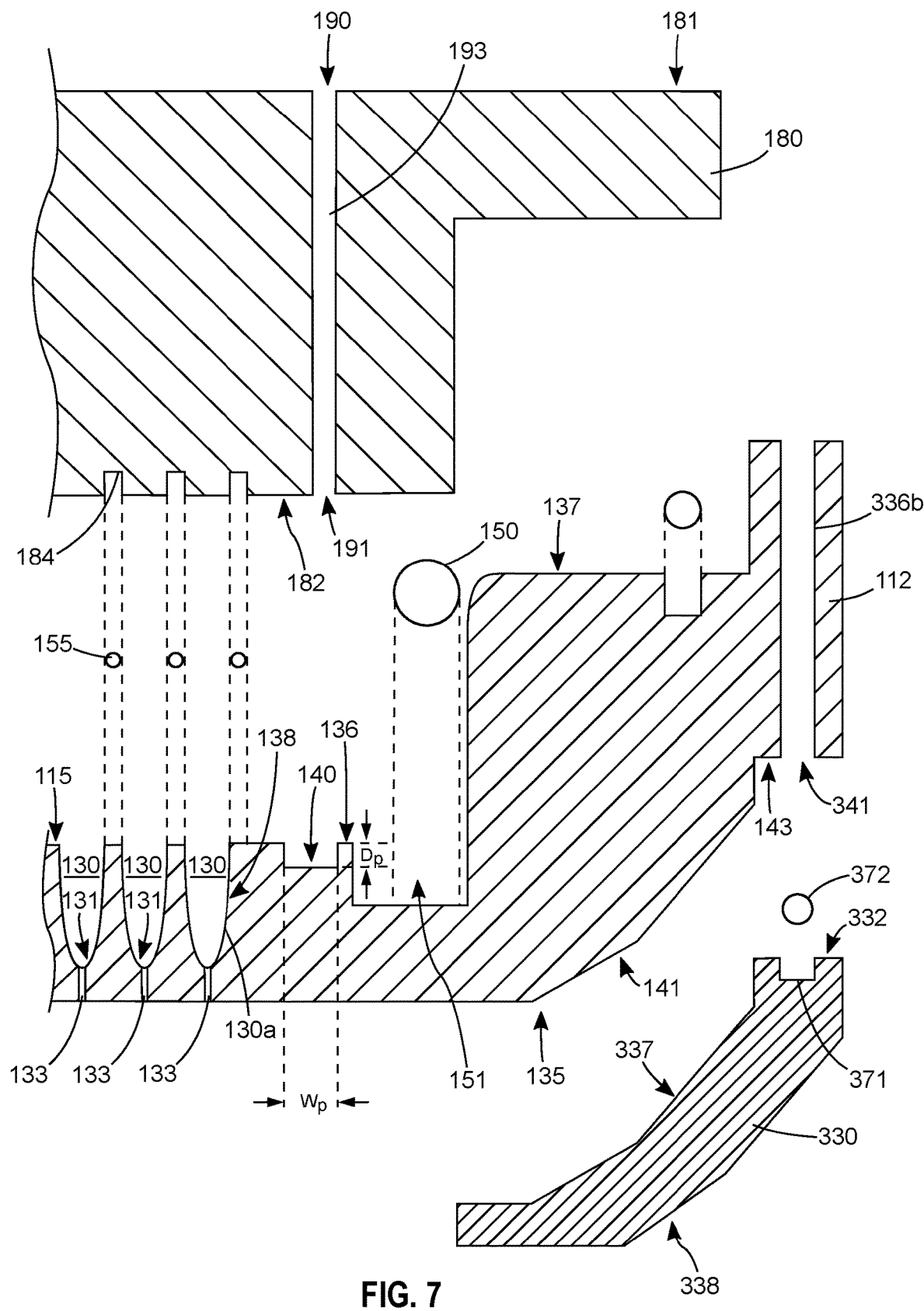
FIG. 7 is a partial cross-sectional exploded schematic view of a gas distribution assembly within a region similar to that of FIG. 6.
Figure 8:
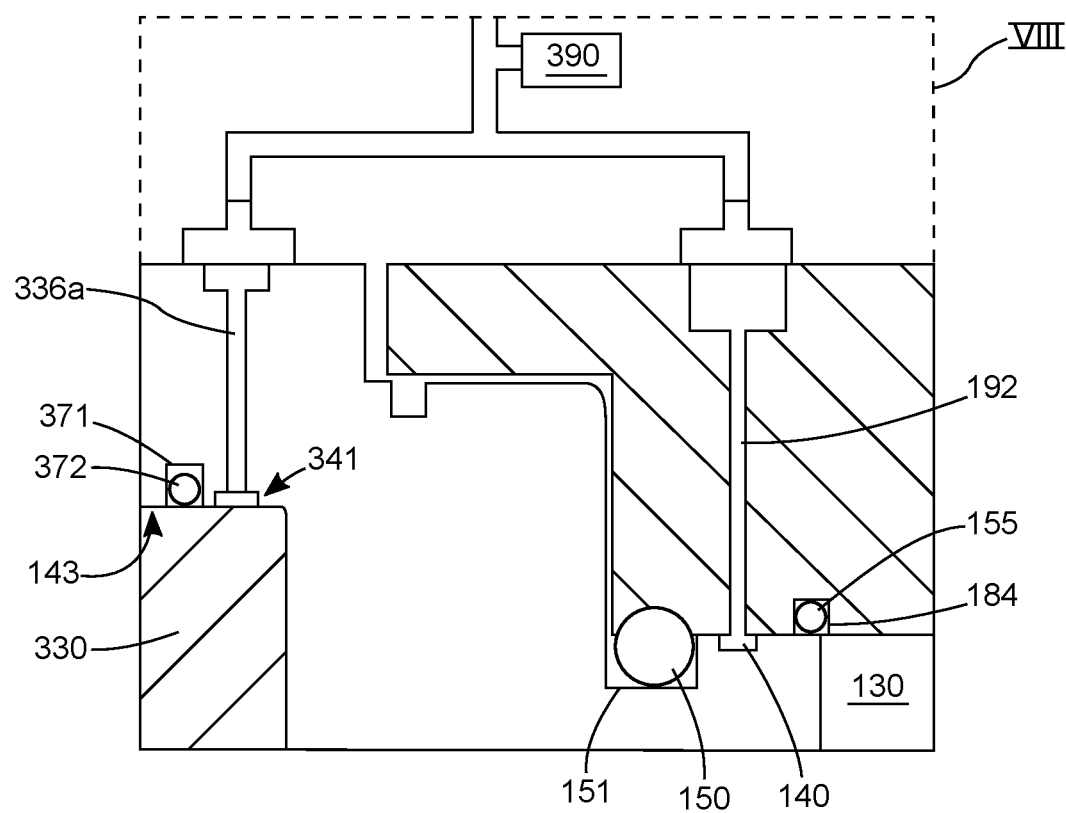
FIG. 8 is a partial cross-sectional schematic view of a region similar to region VIII of FIG. 5.

FIGS. 5 through 8 illustrate one or more embodiments of a gas distribution assembly 105. FIG. 5 illustrates a cross-sectional schematic view of a processing chamber 100 with the gas distribution assembly 105. FIG. 6 illustrates a schematic cross-sectional view of a gas distribution assembly 105 similar to that of region VI in FIG. 5. FIG. 7 illustrates an exploded view of the gas distribution assembly 105 of FIG. 6. FIG. 8 illustrates a schematic cross-sectional view of a gas distribution assembly 105 similar to that of region VIII in FIG. 5.

In some embodiments, the gas distribution assembly 105 comprises a gas distribution plate 112 with a lid 180. The gas distribution plate 105 has a front surface 114 and a back surface 115 defining a thickness of the gas distribution plate 112. In the illustrated embodiment the outer peripheral regions of the gas distribution plate 112 have surface features and contact surfaces that are described below and are not considered part of the back surface 115. The back surface 115 is the surface of the gas distribution plate 112 that another component can contact and provide a fluid path for gases to pass through the thickness of the gas distribution plate 112 through a plurality of apertures 133 extending through the thickness.

In the illustrated embodiment, the gas distribution plate 112 comprises a plurality of channels 130 formed in the back surface 115. Each of the plurality of channels 130 extends a distance toward the front surface 114 to a channel bottom 131 and the apertures 133 are positioned within the channels 130 to extend from the channel bottom 131 to the front surface 114 of the gas distribution plate 112.

In the illustrated embodiment, the gas distribution plate 112 has a sealing region 135 at an outer peripheral edge. The sealing region 135 of some embodiments extends beyond the back surface 115 and is not part of the back surface 115. The sealing region 135 of some embodiments has one or more contact surfaces configured to be positioned adjacent to or in contact with an adjacent component. In some embodiments, the sealing region 135 has a first contact surface 136 and a second contact surface 137.

In some embodiments, the first contact surface 136 comprises a purge channel 140 formed therein. The purge channel 140 has a width $W_p$ measured from a center of the gas distribution plate toward the outer edge of the gas distribution plate and a depth $D_p$ measured from the contact surface into the body of the gas distribution plate. The width $W_p$ of the purge channel 140 can be any suitable width. In some embodiments, the width $W_p$ of the purge channel 140 is in the range of about 0.1 mm to about 50 mm, or in the range of about 0.5 mm to about 25 mm, or in the range of about 1 mm to about 10 mm. In some embodiments, the depth Dp of the purge channel 140 is in the range of about 0.1 mm to about 10 mm, or in the range of about 0.5 mm to about 5 mm.

The purge channel 140 extends around the periphery of the back surface 115 of the gas distribution plate 112. The boundary of the back surface 115 of some embodiments is the area of the gas distribution plate 112 within the perimeter of the purge channel 140. In some embodiments, the width and/or depth of the purge channel 140 changes along the length of the channel so that the purge channel is wider in some areas and deeper in others. In some embodiments, the width and/or depth of the purge channel remains substantially the same along the length (perimeter measured at the mid width of the channel). As used in this manner, the term "substantially the same" means that the width of the channel at any location is within ±10%, ±5%, ±2% or ±1% of the average width of the channel.

The gas distribution assembly 105 includes a lid 180. The lid 180 has a back surface 181 and a front surface 182. The lid 180 is configured to have the front surface 182 is be positioned adjacent the back surface 115 of the gas distribution plate 112. In some embodiments, the lid 180 directly contacts the gas distribution plate 112. In some embodiments, the lid 180 contacts the gas distribution plate through one or more 0-rings.

The lid 180 of some embodiments comprises a purge gas line 190 with one or more opening 191 at the front surface 182 of the lid 180. In some embodiments, the opening 191 of the purge gas line 190 extends around the periphery of the front surface 182 and separates the front surface 182 from the contact surfaces outside the perimeter of the purge gas line opening 191. The purge gas line 190 has a purge gas line inlet 192 (shown in FIG. 8) and a purge gas line outlet 193 (shown in FIGS. 6 and 7). Each of the purge gas line inlet 192 and outlet 193 has an opening 191 at the front surface 182. In some embodiments, the inlet 192 opening 191 and outlet 193 opening 191 are aligned with the purge channel 140 formed in the first contact surface 136 of the gas distribution plate 112.

In some embodiments, a primary O-ring 150 is positioned between the purge channel 140 of the first contact surface 136 and the second contact surface 137. In some embodiments, the primary O-ring 150 is positioned in a primary O-ring recess 151 in the first contact surface 136 of the gas distribution plate 112. The depth of the primary O-ring recess 151 can be varied based on, for example, the particular O-ring 150 being used or the shape of the lid. Any suitable material known to the skilled artisan can be used for the primary O-ring 150.

In some embodiments, as shown in FIGS. 6 and 7, a secondary O-ring 155 is positioned between the back surface 115 of the gas distribution plate 112 and the front surface 182 of the lid 180. In some embodiments, as illustrated, the second O-ring 155 is positioned on an opposite side of the purge channel 190 from the primary O-ring 150. Stated differently, in some embodiments, the secondary O-ring 155 is positioned within the periphery of the primary O-ring 150 or within the periphery of the purge channel 190. The secondary O-ring 155 of some embodiments segregates the channels of the segregation o-ring between channels of the gas distribution plate.

The secondary O-ring 155 of some embodiments segregates adjacent channels 130 formed in the back surface 115 of the gas distribution plate 112. In some embodiments, the secondary O-ring 155 is positioned within a recess 184 formed in one or more of the back surface 115 of the gas distribution plate 112 or the front surface 182 of the lid 180. The illustrated embodiment shows the secondary O-ring 155 positioned within recesses 184 in the front surface 182 of the lid 180. The secondary O-ring 155 of some embodiments is aligned with the outer edge 138 of the outermost channel 130a. The secondary O-ring 155 of some embodiments separates the gas flow path from the lid 180 through the gas distribution plate 112 to the process chamber from the purge channel 190.

In some embodiments, there is a secondary O-ring 155 positioned between each of the channels 130 in the back surface 115 of the gas distribution plate 112. In some embodiments, the secondary O-ring 155 is aligned with a partition separating the adjacent channels. In some embodiments, the channels 130 form one or more intertwined spiral paths and the recesses 184 have a complementary shape and the second O-ring 155 extends along the recesses 184.

Some embodiments of the gas distribution plate 112 further comprises a spacer ring 330 between the gas distribution plate 112 and the opening 310 in the top plate 300. The spacer ring 330 has an inside surface 337, an outside surface 338 and a back surface 332. The inside surface 337 is positioned adjacent an outside surface 141 of the gas distribution plate 112. As shown in FIG. 7, in some embodiments, the back surface 332 of the spacer ring 330 is positioned adjacent a third contact surface 143 in the sealing region 135 of the gas distribution plate 112.

Referring to FIGS. 5 and 8, the gas distribution plate 112 of some embodiments further comprises a spacer ring 330 purge gas line 336 extending through the gas distribution plate 112 from the back surface of sealing region 135 to the third contact surface 143. In some embodiments, the spacer ring purge gas line 336 comprises a spacer ring purge gas line inlet 336a with an opening 341 at the back surface of the sealing region 135 of the gas distribution plate 112 and a spacer ring purge gas line outlet 336b with an opening 341 at the back surface of the sealing region 135 of the gas distribution plate 112. In some embodiments, the inlet opening 341 and outlet opening 341 are aligned with a spacer ring purge channel 371. In some embodiments, as shown in FIG. 8, the spacer ring purge channel 371 is formed in the third contact surface 143 of the gas distribution plate 112. In some embodiments, as shown in FIG. 7, the spacer ring purge channel 371 is formed in the back surface 332 of the spacer ring 330. In some embodiments, a spacer ring purge channel O-ring 372 is in the spacer ring purge channel 371.

Some embodiments of the gas distribution assembly 105, as shown in FIGS. 5 and 8, further comprise a pressure transducer 390 in communication with the purge gas line inlet 192. In some embodiments, the pressure transducer 390 is in fluid communication with the purge gas line inlet 192 so that a purge gas 391 flowing through line 392 can be controlled to maintain the pressure differential. In some embodiments, the pressure transducer 390 controls the flow of purge gas into both the purge gas line inlet 192 and the spacer ring purge gas line inlet 336a at the same time. In some embodiments, there is a separate pressure transducer for the spacer ring purge gas line 336a than the purge gas line inlet 192. In some embodiments, a pressure gauge 393 is in the purge gas line upstream of the inlet 192. In some embodiments, there is a pressure gauge 393 position in the purge gas line outlet 193. In some embodiments, the pressure transducer 390 is in communication with one or more of the purge gas line inlet 192 of the spacer ring purge gas line inlet 336a. In some embodiments, the pressure transducer 390 is in communication with one or more of the purge gas line inlet 192 or the spacer ring purge gas line inlet 336a. In some embodiments, a pressure gauge 393 is positioned in one or more of the purge gas line outlet 193 or the spacer ring gas line outlet 336b.

Some embodiments of the gas distribution assembly 105 include a controller 495, as shown in FIG. 4. The controller 495 of some embodiments is configured to control the pressure transducer 390 based on measurements from the pressure gauge 393 to provide a flow of inert gas into the purge gas line inlet 192 sufficient to maintain substantially no pressure differential between the gas distribution plate 112 and the purge channel 140. In some embodiments, the controller 495 is configured to control the pressure transducer 390 based on measurements from the pressure gauge 393 to provide a flow of inert gas into one or more of the purge gas line inlet 192 or spacer ring gas line inlet 336a sufficient to maintain substantially no pressure differential between the gas distribution plate 112 and the purge channel 140 or between the gas distribution plate 112 and the spacer ring purge channel 371.

One or more embodiments of the disclosure are directed to methods of sealing a process chamber. The pressure in a purge gas line is measured at any suitable position along the flow path of the purge gas. In some embodiments, the pressure is measured upstream of the purge gas line inlet, within the purge gas line channel or downstream of the purge gas line outlet. A flow of inert gas is provided into the purge channel so that there is substantially no pressure differential between the gas distribution plate (or the process pressure) and the purge channel.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control, etc.

The controller 495 of some embodiments has one or more configurations selected from: a configuration to measure a pressure in one or more of the gas distribution plate 112 channel 130 or the spacer ring purge gas channel 371; a configuration to actuate a pressure transducer 390 to flow a purge gas into the purge gas line 190 or the spacer ring purge gas line 336; a configuration to control the flow of a purge gas in response to a reading from a pressure gauge in one or more of the purge gas outlet line or the channels in the gas distribution plate.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of sealing a process chamber, the method comprising: measuring a pressure in a purge gas line downstream of a purge gas line outlet aligned with a purge channel in a gas distribution assembly comprising a gas distribution plate and a lid separated by a primary O-ring, the purge gas line in fluid communication with a purge channel and a purge gas line inlet, each of the purge gas line inlet and purge gas line outlet aligned with the purge channel; and providing a flow of inert gas into the purge channel so that there is substantially no pressure differential between the gas distribution plate and the purge channel, the gas distribution assembly further comprises a spacer ring purge gas line extending through the gas distribution plate, wherein the spacer ring purge gas line comprises a spacer ring purge gas line inlet with an opening at a back surface of the gas distribution plate and a spacer ring purge gas line outlet with an opening at the back surface of the gas distribution plate, the inlet opening and outlet opening aligned with a spacer ring purge channel.

2. The method of claim 1, wherein the gas distribution plate further comprises a sealing region at an outer edge of the gas distribution plate.

3. The method of claim 2, wherein the sealing region comprises a first contact surface and a second contact surface, the first contact surface comprising the purge channel therein.

4. The method of claim 3, further comprising positioning the primary O-ring in a primary O-ring recess in the first contact surface.

5. The method of claim 1, further comprising positioning a secondary O-ring between a back surface of the gas distribution plate and a front surface of the lid.

6. The method of claim 5, wherein the secondary O-ring is positioned on an opposite side of the purge channel from the primary O-ring.

7. The method of claim 5, wherein the secondary O-ring is positioned in a recess formed in one or more of the back surface of the gas distribution plate or the front surface of the lid.

8. The method of claim 1, further comprising positioning a pressure transducer in communication with the purge gas line inlet.

9. The method of claim 8, further comprising positioning a pressure gauge in the purge gas line outlet.

10. The method of claim 9, further comprising using a controller configured to control the pressure transducer based on measurements from the pressure gauge to provide a flow of inert gas into the purge gas line inlet sufficient to maintain substantially no pressure differential between the gas distribution plate and the purge channel.

11. The method of claim 3, wherein the spacer ring purge channel is formed in one or more of a third contact surface or the back surface of the spacer ring.

12. The method of claim 1, further comprising positioning a pressure transducer in communication with the spacer ring purge gas line inlet.

13. The method of claim 12, further comprising positioning a pressure gauge in the spacer ring purge gas line outlet.

14. The method of claim 13, further comprising using a controller configured to control the pressure transducer based on measurements from the pressure gauge to provide a flow of inert gas into the spacer ring purge gas line inlet sufficient to maintain substantially no pressure differential between the gas distribution plate and the spacer ring purge channel.

15. The method of claim 1, wherein the gas distribution plate comprises a plurality of channels formed in the back surface, each of the plurality of channels extends a distance toward a front surface of the gas distribution plate to a channel bottom and apertures are positioned within the channels to extend from the channel bottom to the front surface of the gas distribution plate.

16. A method of sealing a process chamber, the method comprising: measuring a pressure in one or more of a purge gas line downstream of a spacer ring purge gas line outlet aligned with a purge channel or a spacer purge gas line in a gas distribution assembly comprising a gas distribution plate and a lid separated by a primary O-ring, the purge gas line in fluid communication with a purge channel and a purge gas line inlet, each of the purge gas line inlet and purge gas line outlet aligned with the purge channel, the spacer ring purge gas line extending through the gas distribution plate, the spacer ring purge gas line comprising a spacer ring purge gas line inlet with an opening at a back surface of the gas distribution plate and a spacer ring purge gas line outlet with an opening at the back surface of the gas distribution plate, the inlet opening and outlet opening aligned with a spacer ring purge channel; and providing a flow of inert gas into one or more of the purge channel or the spacer ring purge channel so that there is substantially no pressure differential between the gas distribution plate and the purge channel or the spacer ring purge channel.

\* \* \* \* \*